(12) United States Patent
Chang et al.

(10) Patent No.: US 7,791,582 B2
(45) Date of Patent: Sep. 7, 2010

(54) SHIFT REGISTER TURNING OFF A SIGNAL GENERATING CIRCUIT ACCORDING TO A SIGNAL FROM A FEEDBACK CIRCUIT

(75) Inventors: Lee-Hsun Chang, Yun-Lin County (TW); Yu-Wen Lin, Taichung County (TW); Chun-Ching Wei, Taipei (TW); Wei-Cheng Lin, Taichung County (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 878 days.

(21) Appl. No.: 11/382,717

(22) Filed: May 11, 2006

(65) Prior Publication Data

US 2007/0164971 A1 Jul. 19, 2007

(30) Foreign Application Priority Data

Jan. 16, 2006 (TW) .............................. 95101611 A (51) Int. Cl.
*G09G 3/36* (2006.01)
(52) U.S. Cl. .......................................... 345/100; 377/72
(58) Field of Classification Search ........... 345/87–104, 345/204; 377/64–81
See application file for complete search history.

(56) References Cited

U.S. PATENT DOCUMENTS 5,859,630 A 1/1999 Huq

| 2003/0227433 | A1* | 12/2003 | Moon ........................ 345/100 |
| 2003/0231735 | A1* | 12/2003 | Moon et al. ................... 377/64 |
| 2005/0212746 | A1* | 9/2005 | Iwasaki et al. .............. 345/100 |
| 2006/0001637 | A1* | 1/2006 | Pak et al. .................... 345/100 |
| 2007/0019775 | A1* | 1/2007 | Tsai et al. ..................... 377/64 |

FOREIGN PATENT DOCUMENTS

| CN | 1553454 A | 12/2004 |
| CN | 1725287 A | 1/2006 |
| GB | 2 343 067 A | 4/2000 |
| JP | 2005166139 | 6/2005 |
| TW | 355785 | 4/1999 |
| TW | 533389 | 5/2003 |

* cited by examiner

*Primary Examiner*—Chanh Nguyen
*Assistant Examiner*—Sanghyuk Park
(74) *Attorney, Agent, or Firm*—Winston Hsu (57) ABSTRACT

A shift register includes a signal generating circuit for generating an output signal at an output end of the shift register according to a first clock signal while the signal generating circuit is turned on; a driving circuit, electrically coupled to the signal generating circuit, for generating a driving signal to control the signal generating circuit according to an input signal received from an input end of the shift register; a feedback circuit, electrically coupled to a next stage shift register, for transmitting a control signal while the feedback circuit is turned on by the next stage shift register; and a control switch, electrically coupled to the signal generating circuit and the feedback circuit, for turning off the signal generating circuit while the control switch is turned on by the control signal from the feedback circuit.

19 Claims, 10 Drawing Sheets

SHIFT REGISTER TURNING OFF A SIGNAL GENERATING CIRCUIT ACCORDING TO A SIGNAL FROM A FEEDBACK CIRCUIT

BACKGROUND OF THE INVENTION

1. Field of the Invention

The present invention relates to a shift register, and more particularly, to a shift register capable of turning on a feedback circuit according to a signal from a next stage shift register.

2. Description of the Prior Art

Liquid crystal displays (LCD) are flat screen display panels that use a glass base manufacturing material. It is necessary to find ways to reduce the cost of manufacturing the LCD. Driving a control circuit using a thin film transistor (TFT) technology to make the glass base of the LCD will be a future trend utilized to realize cost reduction. This is in contrast to the current method of manufacturing wherein the silicon layer for TFT LCD is deposited from silane gas to produce a polycrystalline silicon layer that is far less suitable for producing high-grade transistors.

Figure 1:
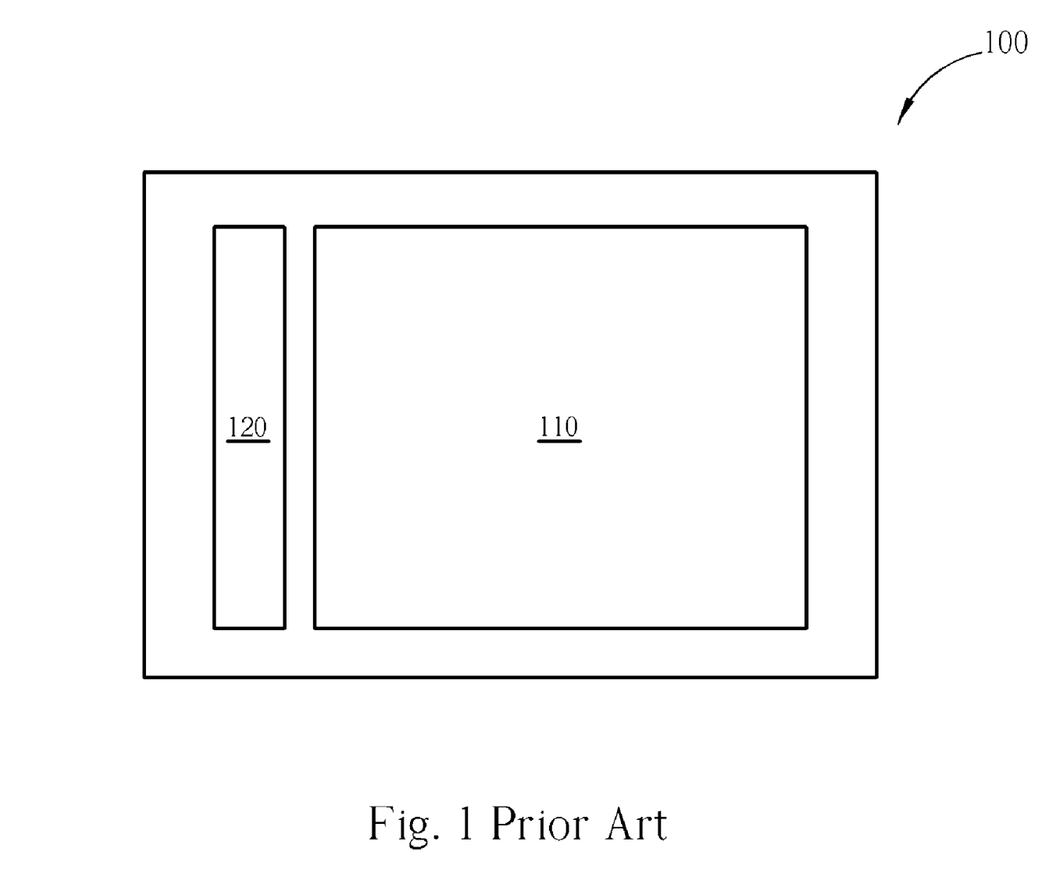
FIG. 1 illustrates a diagram of a conventional LCD.
Figure 2:
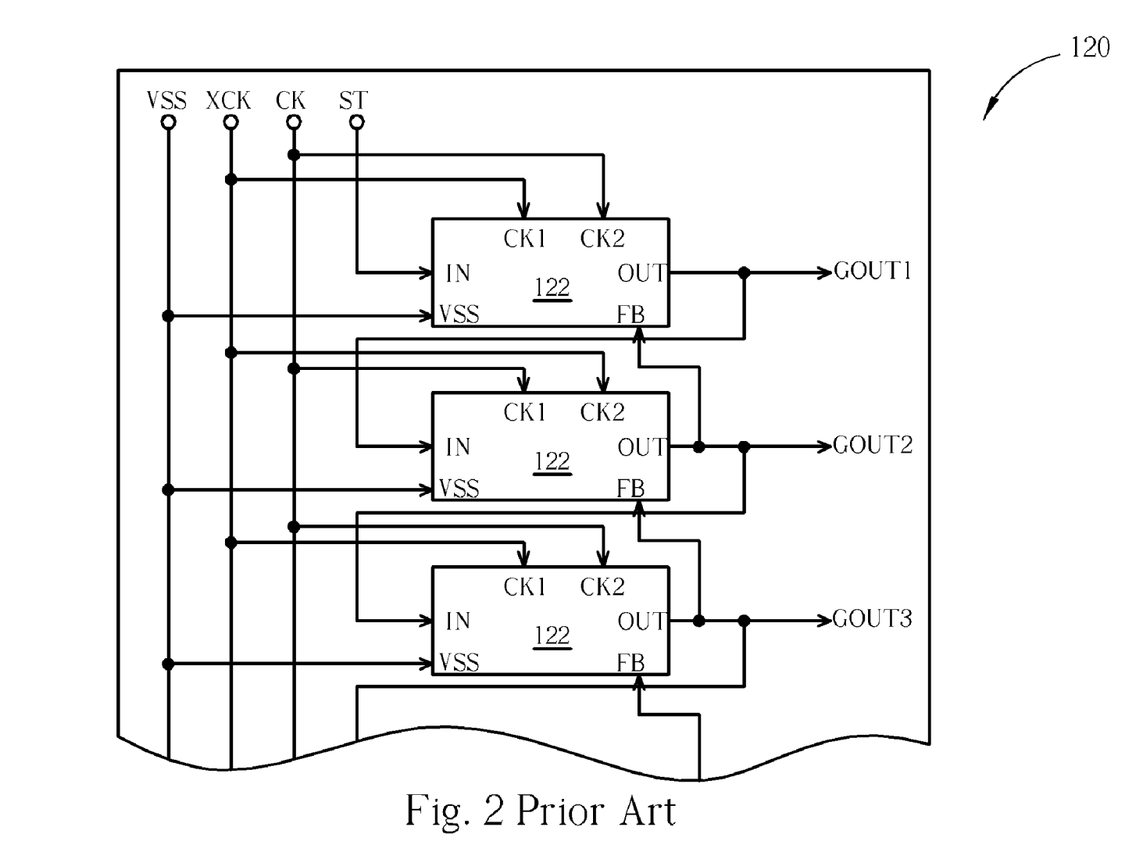
FIG. 2 illustrates a diagram of a gate driving circuit of the LCD of FIG. 1.
Figure 3:
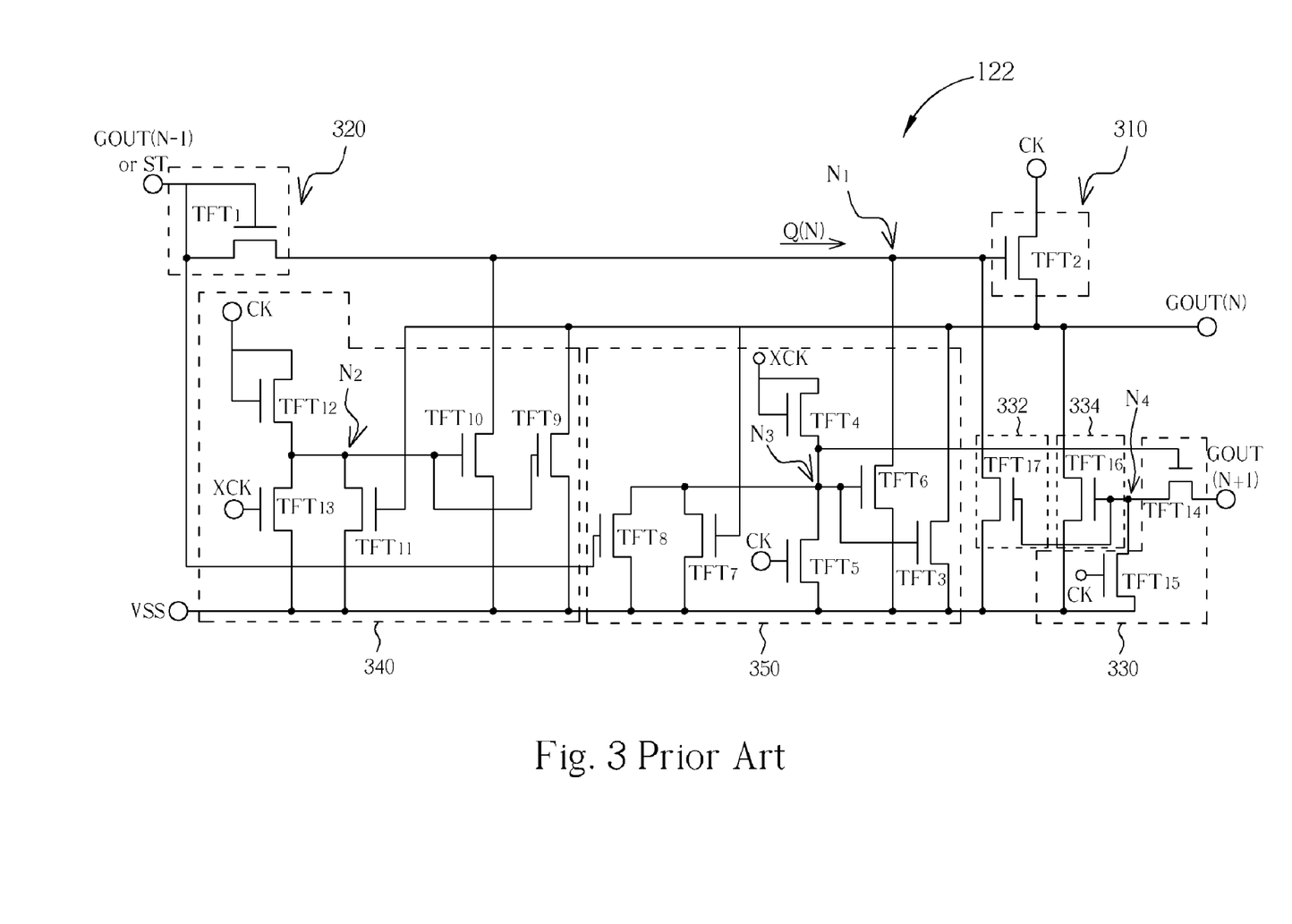
FIG. 3 illustrates a diagram of a stage shift register of the gate driving circuit of FIG. 2.

Referring to FIG. 1 to FIG. 3. FIG. 1 illustrates a diagram of a conventional LCD 100. FIG. 2 illustrates a diagram of a gate driving circuit 120 of the LCD 100 of FIG. 1. FIG. 3 illustrates a diagram of a stage shift register 122 of the gate driving circuit 120 of FIG. 2. As illustrated in the figures, the LCD 100 includes a display array 100, and a gate driving circuit 120. The display array 100 is utilized for displaying images, and the gate driving circuit 120 is utilized for driving the display array 110. The gate driving circuit 120 includes a plurality of stage shift registers 122. The stage shift registers 122 are electrically coupled in a series and a gate signal GOUT is generated to drive the display array 110 according to a first clock signal CK and a second clock signal XCK sequentially, and the phase of the second clock signal XCK is opposite to the phase of the first clock signal CK. Regarding the connection of each stage shift register 122, the first clock signal CK and the second clock signal XCK alternately exchange information, at the same time a clock signal input end CK1 and a clock signal input end CK2 are alternately electrically coupled to the first clock signal CK and the second clock signal XCK. Each stage shift register 122 has an output end OUT, an input end IN, and a feedback end FB. Furthermore, the stage shift register 122 includes a signal generating circuit 310, a driving circuit 320, a feedback circuit 330, a control switch 332, an output switch 334, and two reset circuits 340, 350. As illustrated in FIG. 3, the signal generating circuit 310 is utilized for generating a gate signal GOUT(N) at the output end OUT of the shift register 122 according to the first clock signal CK (Please note that the second clock signal XCK can be used in place of the first clock signal CK) while the signal generating circuit 310 is being turned on. The driving circuit 320 is utilized for generating a driving signal Q(N) to control the signal generating circuit 310 according to the input signal received by the input end IN of the shift register 122. The input signal received by the input end IN of the shift register 122 is the gate signal GOUT(N−1) or a start signal (ST) outputted by a previous stage shift register. The feedback circuit 330 is utilized for transmitting a control signal to the control switch 332 and the output switch 334 while the feedback circuit 332 is being turned on. The on and off operation of the feedback circuit 332 is controlled by the second clock signal XCK (which can also be the first clock signal CK). The control switch 332 and the output switch 334 are respectively utilized for turning off the signal generating circuit 310 and resetting the gate signal GOUT(N) outputted by the output end OUT while the control switch 332 and the output switch 334 are turned on by the control signal transmitted by the feedback circuit 330 (i.e., voltage of the output end is being lowered to a predetermined low electrical potential VSS), and the control signal transmitted by the feedback circuit 330 is a gate signal GOUT(N+1) outputted by an output end of a previous stage shift register received by the feedback end FB. The reset circuits 340, 350 are utilized for alternately turning off the signal generating circuit 310 and resetting the output signal of the output end OUT according to the first clock signal CK and the second clock signal XCK.

Figure 4:
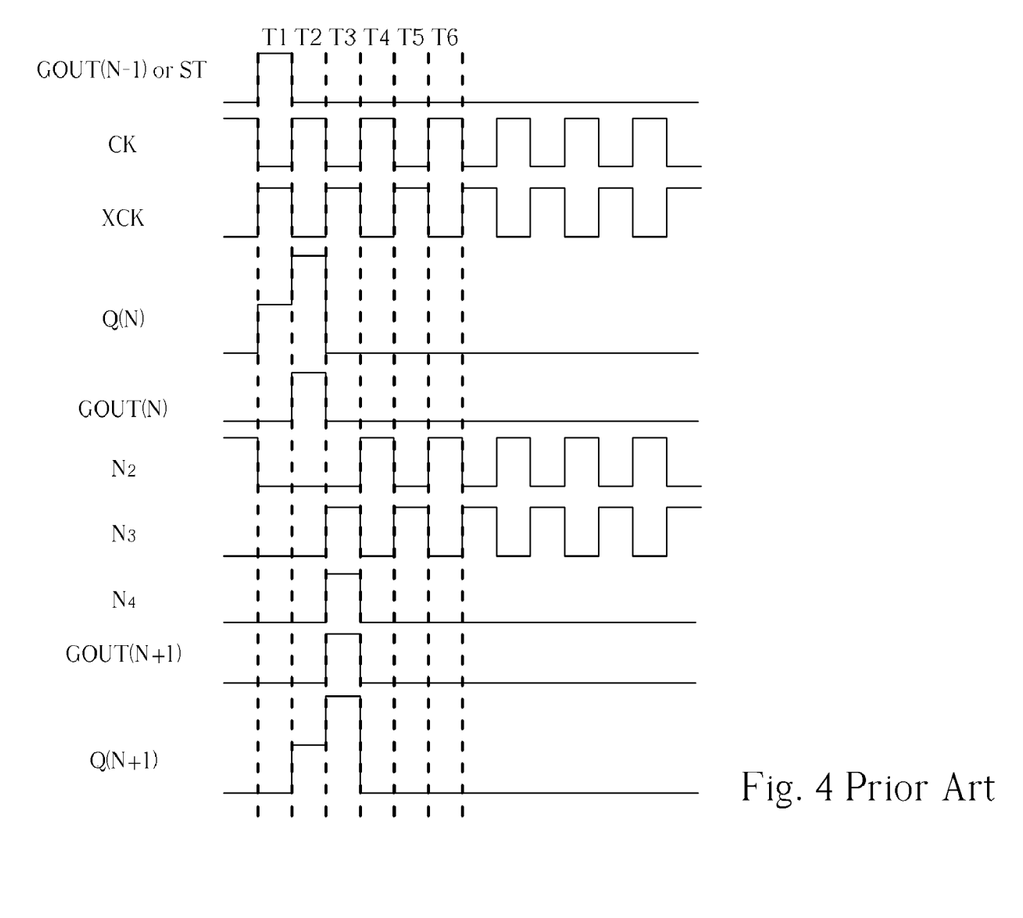
FIG. 4 illustrates a clock diagram of each related signal of a shift register during operation.

To further explain the detailed operation of the conventional shift register 122, please refer to FIG. 4 and FIG. 3 at the same time. FIG. 4 illustrates a clock diagram of each related signal of a shift register 122 during operation. As illustrated in FIG. 4, in time T1, the input signal (which can be the gate signal GOUT(N−1) or a start signal (ST) outputted by the output end of the previous stage shift register) is being raised to a high electrical potential, hence the thin film transistor (TFT) $TFT_1$ of the driving circuit 320 is initialized and the electrical potential of the driving signal Q(N) is raised and the signal generating circuit 310 is also initialized. However, the first clock signal CK at T1 is at low electrical potential, the gate signal GOUT(N) outputted by the output end OUT remains at low electrical potential, furthermore the control switch 332 and the output switch 334 do not operate at point $N_4$ because the electrical potential is low (the feedback signal GOUT (N+1) of the feedback end FB is at low electrical potential), the reset circuit 340 does not operate at point $N_2$ because electrical potential is low (the first clock signal CK is at low electrical potential), and the reset circuit 350 does not operate at point $N_3$ because electrical potential is low (the input signal GOUT(N−1) or ST initializes $TFT_8$ at T1).

At time T2, the input signal GOUT(N−1) or ST received by the input end IN is being lowered to low electrical potential, thus $TFT_1$ of the driving circuit 320 is turned off, however, the signal generating circuit 310 is still turned on and the electrical potential of the driving signal Q(N) (which is the electrical potential of point $N_1$) is raised to high electrical potential due to electric capacitance on the first clock signal CK when the first clock signal CK is raised to high electrical potential. Additionally, at this time, the gate signal GOUT(N) outputted by the output end OUT becomes high electrical potential. Furthermore, the control switch 332 and the output switch 334 do not operate at point $N_4$ because electrical potential is low (because $TFT_{15}$ is turned on by the first clock signal CK at T2), and because the second clock signal XCK is at low electrical potential the reset circuit 340 does not operate at point $N_3$ because electrical potential is low.

At time T3, the second clock signal XCK turns on $TFT_{14}$ of the feedback circuit 330 and $TFT_{14}$ is raised to high electrical potential due to the feedback signal GOUT(N+1) of the feedback end FB which directly causes point $N_4$ to be of high electrical potential. This action also results in three additional events: first, turning on the control switch 332 and the output switch 334; second, turning off the signal generating circuit 310 (point $N_1$ is lowered to be low electrical potential); and third, lowering the gate signal GOUT(N) outputted by the output end OUT to be low electrical potential. Furthermore, because the first clock signal CK is at low electrical potential the reset circuit 340 does not operate at point $N_2$ because electrical potential is low, however, because the second clock signal XCK is of high electrical potential the reset circuit 350 at point $N_3$ is of high electrical potential and at the same time that $TFT_3$, $TFT_6$ are being turned on, the signal generating circuit 310 is being turned off, and the gate signal GOUT(N) outputted by the output end OUT is being lowered to be low electrical potential.

Within other following time, the reset circuit 340 and the reset circuit 350 will operate alternately to turn off the signal generating circuit 310 and lower the gate signal GOUT(N) outputted by the output end to be at low electrical potential until the input signal GOUT(N−1) of the input end IN or ST is again raised to be of high electrical potential. Also, a next stage shift register 122 will repeat the above-mentioned actions thereby sequentially generating the gate signal GOUT to drive the display array 10.

However, $TFT_{14}$ of the feedback circuit 330 of each stage shift register 122 continuously receives the drive of the second clock signal XCK (which can also be the first clock signal CK), in the current manufacturing method. The efficiency of the TFT will be reduced due to protracted operating time. The driving electrical potential will increase while the TFT is turned on, thus long operating time can cause the shift register 122 function to stop operating and can even reduce the operation life span which can cause damage to the gate driving circuit 120.

SUMMARY OF THE INVENTION

The present invention relates to a shift register comprising a signal generating circuit for generating an output signal at an output end of the shift register according to a first clock signal while the signal generating circuit is being turned on; a driving circuit, electrically coupled to the signal generating circuit, for generating a driving signal to control the signal generating circuit according to an input signal received by an input end of the shift register; a feedback circuit, electrically coupled to a next stage shift register, for transmitting a control signal while the feedback circuit is being turned on by the next stage shift register; and a control switch, electrically coupled to the signal generating circuit and the feedback circuit, for turning off the signal generating circuit while the control switch is being turned on by the control signal transmitted from the feedback circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
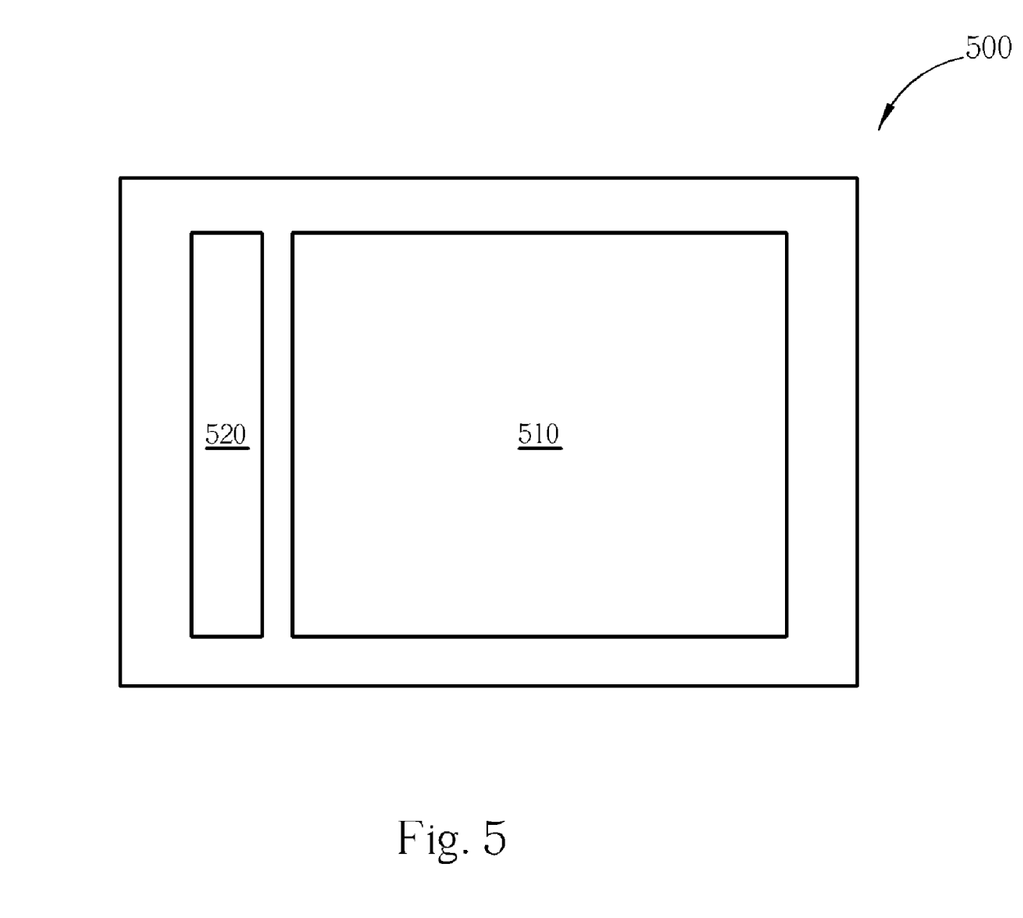
FIG. 5 illustrates a diagram of an LCD according to the present invention.
Figure 6:
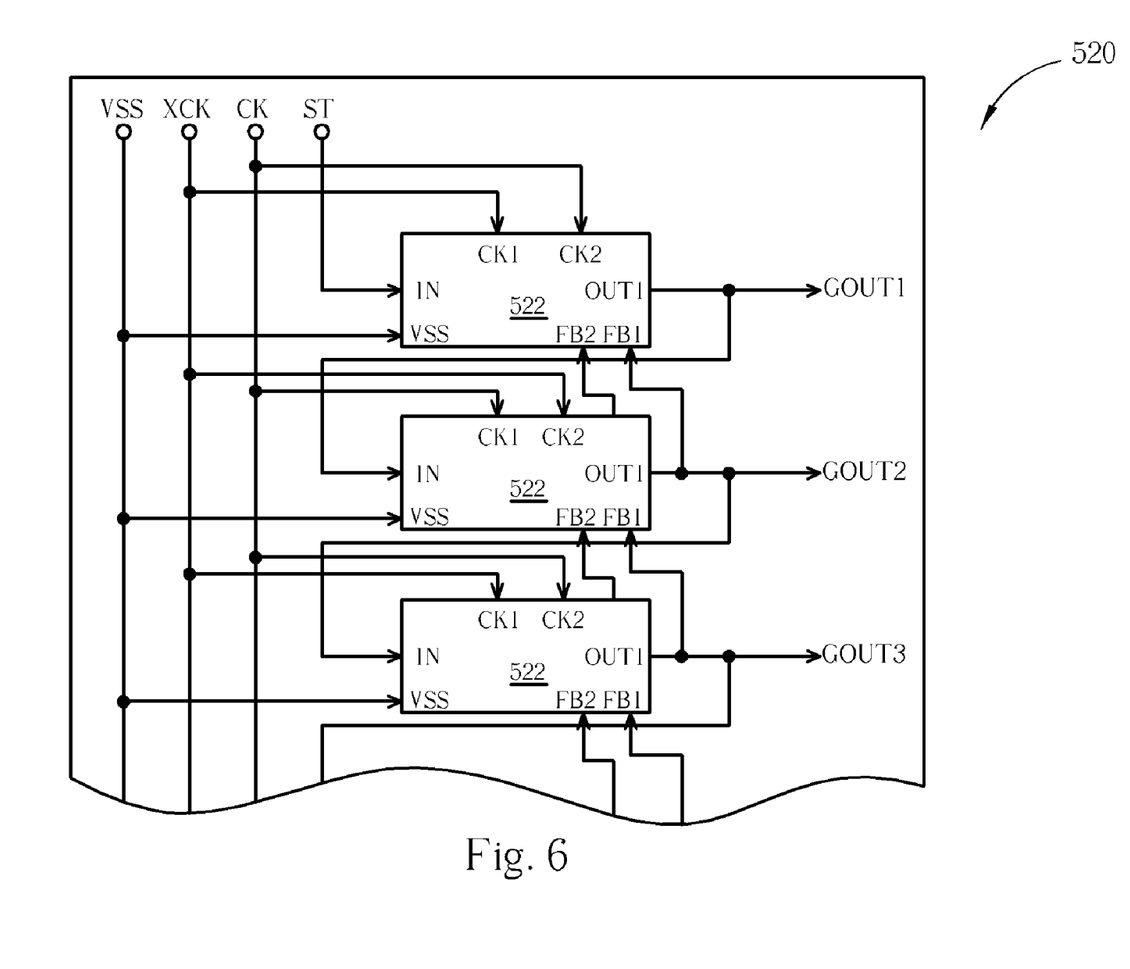
FIG. 6 illustrates a diagram of a gate driving circuit of the LCD of FIG. 5.
Figure 7:
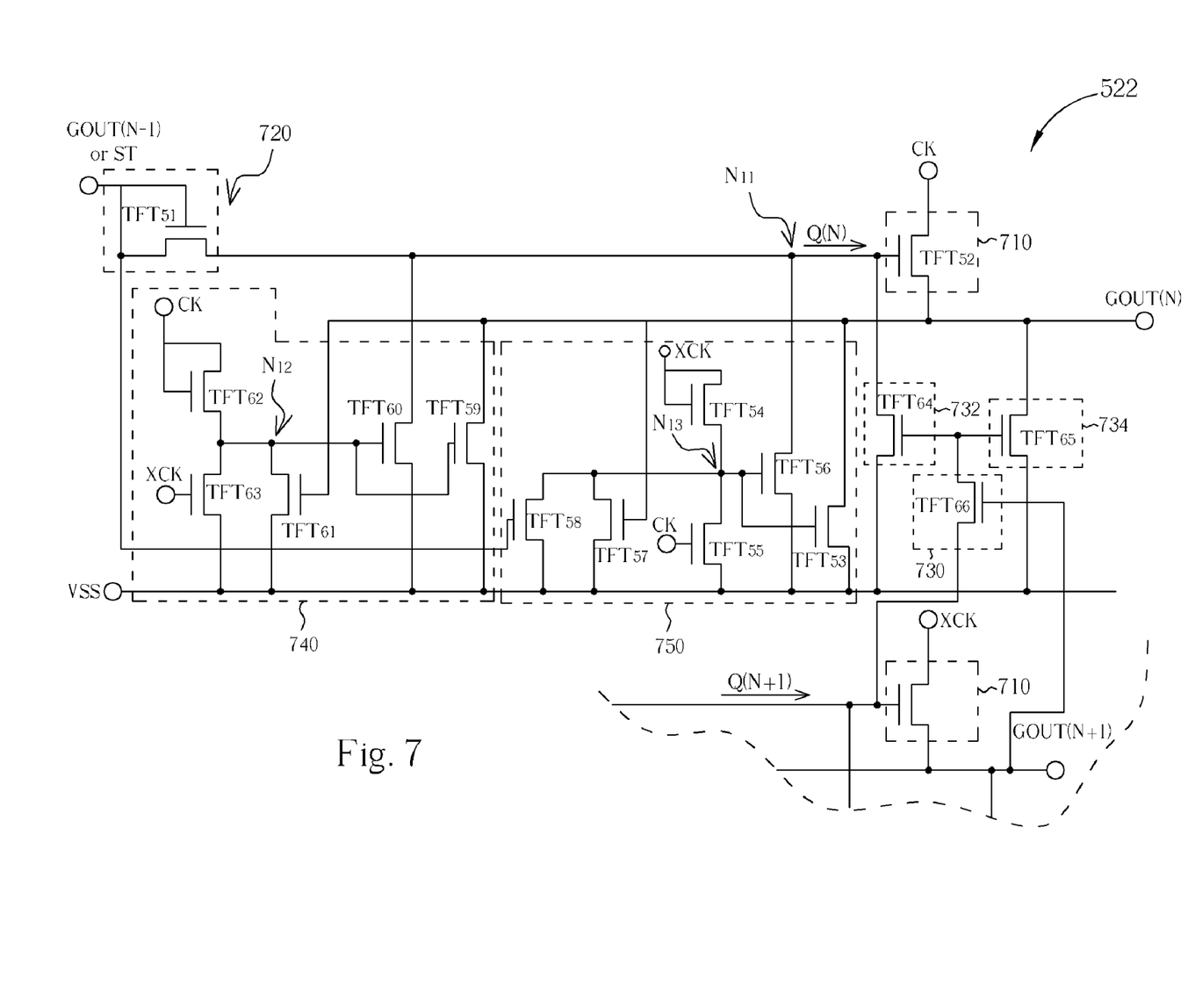
FIG. 7 illustrates a shift register of the gate driving circuit of FIG. 6.

Referring to FIG. 5 through to FIG. 7. FIG. 5 illustrates a diagram of an LCD 500 according to the present invention. FIG. 6 illustrates a diagram of a gate driving circuit 520 of the LCD 500 of FIG. 5. FIG. 7 illustrates a shift register of the gate driving circuit 520 of FIG. 6. The LCD 500 of the present invention includes a display array 510, and a gate driving circuit 520. The display array 510 is utilized for displaying images, and the gate driving circuit 520 is utilized for driving the display array 510. The gate driving circuit 520 includes a plurality of stage shift registers 522, the stage shift registers 522 are electrically coupled in a series and a gate signal GOUT is generated to drive the display array 510 according to a first clock signal CK and a second clock signal XCK sequentially, and phase of the second clock signal XCK is opposite to the phase of the first clock signal CK. Regarding the connection of each stage shift register 522, the first clock signal CK and the second clock signal XCK alternately exchange information, at the same time a clock signal input end CK1 and a clock signal input end CK2 are alternately electrically coupled to the first clock signal CK and the second clock signal XCK. The difference with the prior art is that in the present invention, each stage shift register 522 has an input end IN and an output end OUT, and two feedback ends FB1 and FB2. Furthermore, other than a feedback circuit 730, the operations of the shift register 522 and other components are quite similar with the prior art, therefore, these will not be reiterated for the sake of brevity. The timing of each related signal while the shift register 522 is operating is shown directly in FIG. 4 (signals of points $N_{11}$, $N_{12}$, $N_{13}$ respectively correspond to points $N_1$, $N_2$, $N_3$, but the signal of point $N_4$ does not exist in this embodiment). The feedback end FB1 of each shift register 522 is electrically coupled to an output end OUT of a next stage shift register, and the feedback end FB2 of each shift register 522 is electrically coupled to a driving circuit 720 of a next stage shift register, hence the feedback circuit 730 is utilized for transmitting a driving signal Q(N+1) generated by the driving circuit 720 of a next stage shift register to a control switch 732 and an output switch 734 while the feedback circuit 730 is being turned on by a gate signal GOUT(N+1) outputted by a next stage shift register, as the gate signal GOUT(N+1) outputted by the next stage shift register is being raised once every operation cycle, thus the feedback circuit 730 will not be on continuously thereby prolonging the operation lifespan. Furthermore, the driving signal Q(N+1) generated by the driving circuit 720 of the next stage shift register has a higher electrical potential due to its electric capacitance, thus the control switch 732 and the output switch 734 can be easily turned on at time T3.

Figure 8:
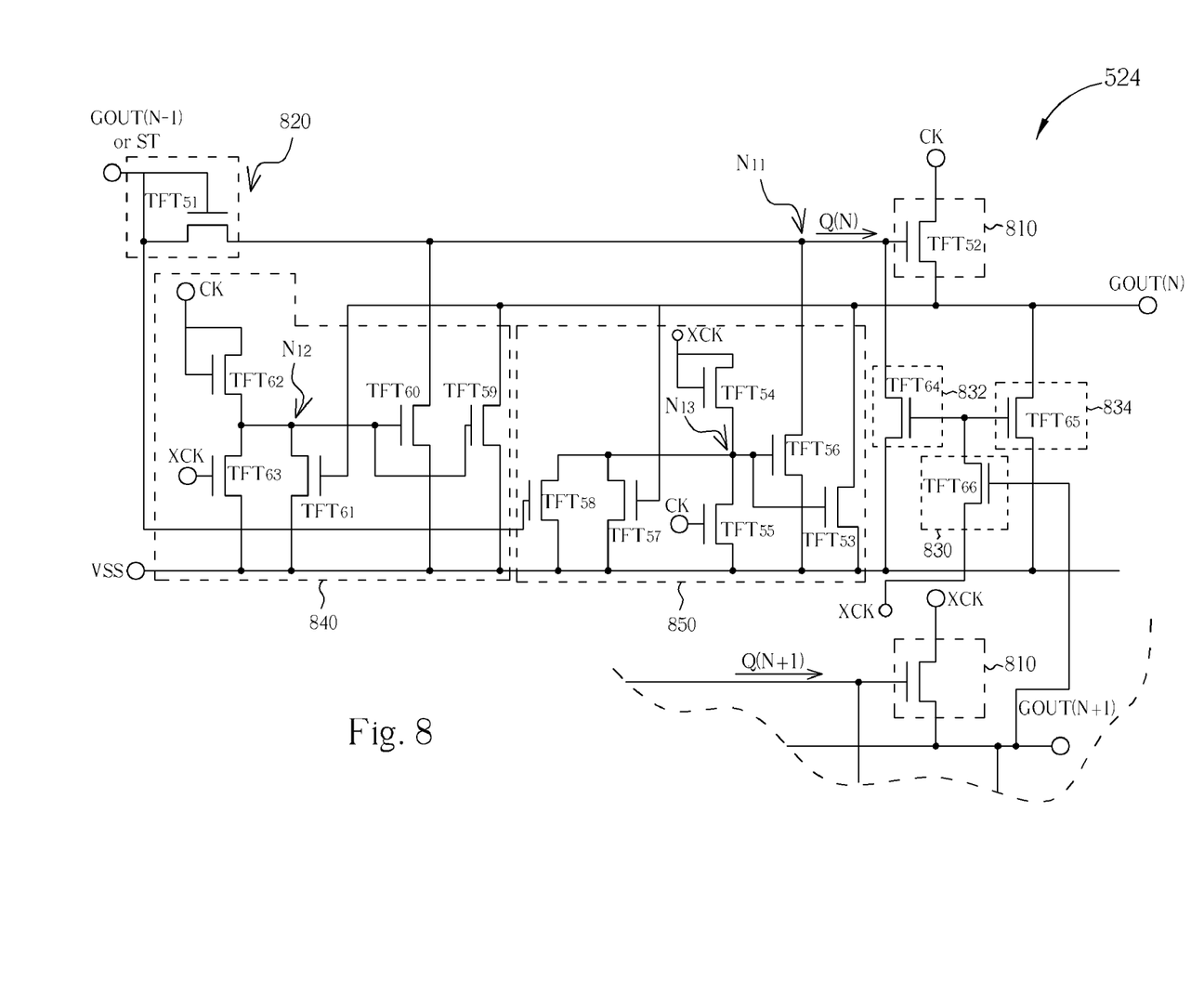
FIG. 8 illustrates a diagram of a shift register according to a second embodiment of the present invention.
Figure 9:
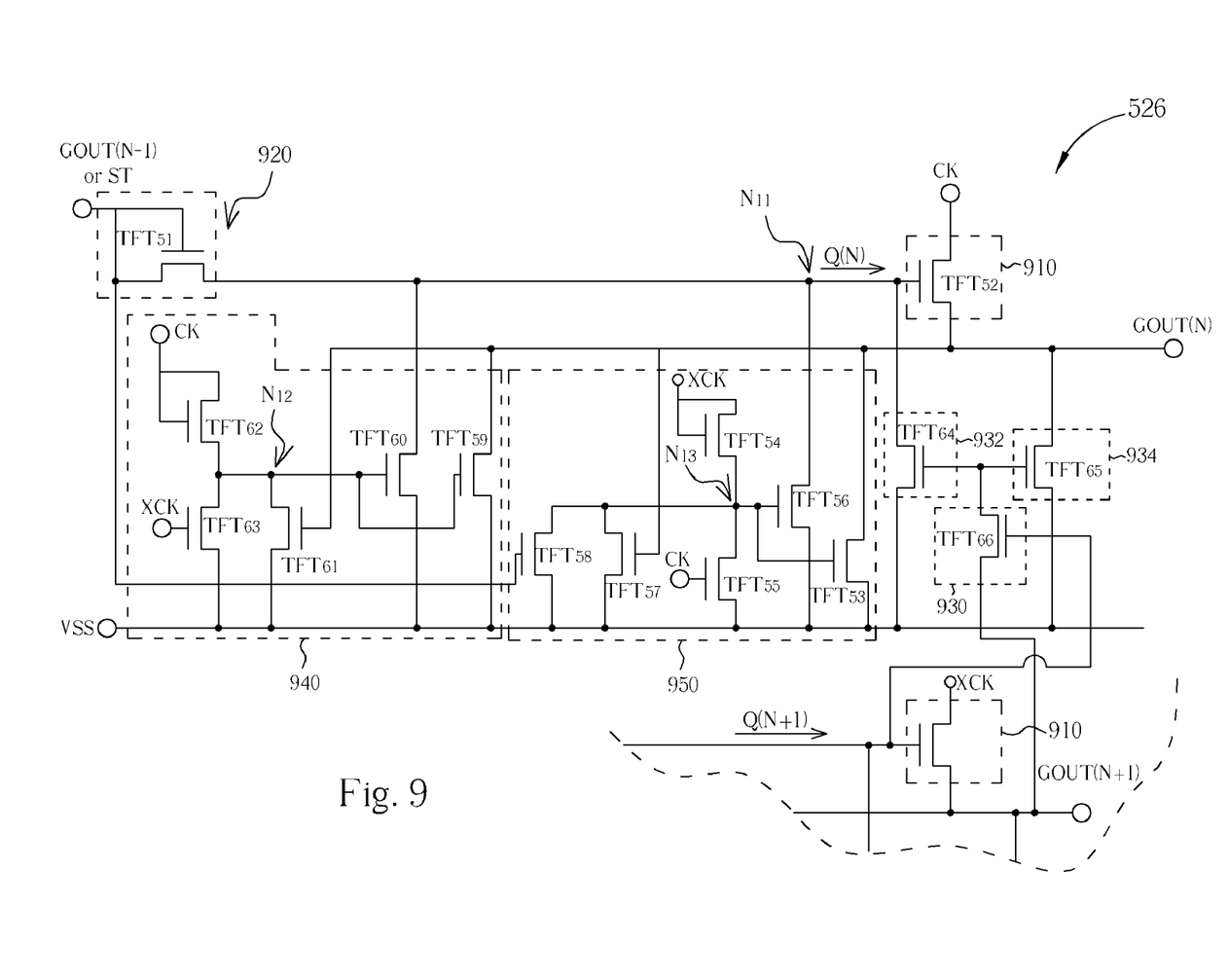
FIG. 9 illustrates a diagram of a shift register according to a third embodiment of the present invention.
Figure 10:
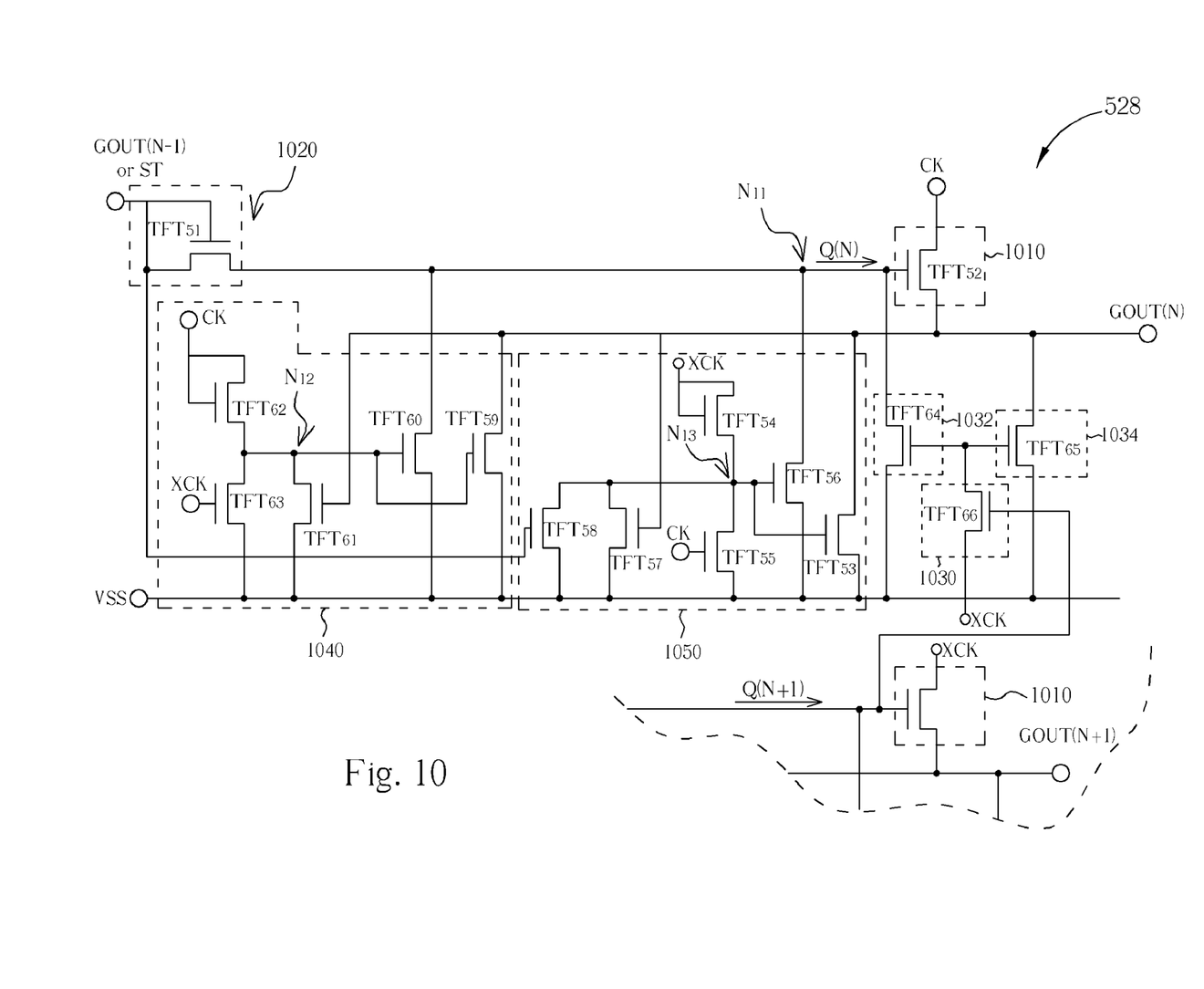
FIG. 10 illustrates a shift register according to a fourth embodiment of the present invention.

Referring to FIG. 8 to FIG. 10. FIG. 8 illustrates a diagram of a shift register according to a second embodiment of the present invention. FIG. 9 illustrates a diagram of a shift register according to a third embodiment of the present invention. FIG. 10 illustrates a shift register according to a fourth embodiment of the present invention. In FIG. 8, a feedback circuit 830 of each stage shift register 524 is electrically coupled to an output end OUT of a next stage shift register and a second clock signal XCK, hence the feedback circuit 830 can be utilized to transmit the second clock signal XCK to a control switch 832 and an output switch 834 while the feedback circuit 830 is being turned on by a gate signal GOUT(N+1) outputted by a next stage shift register. In FIG. 9, a feedback circuit 930 is utilized for transmitting a gate signal GOUT(N+1) outputted by the next stage shift register to a control switch 932 and an output switch 934 while the feedback circuit 930 is turned on by a driving signal Q(N+1) generated by a driving circuit 920 of the next stage shift register although the feedback circuit 930 of each shift register 526 is also electrically coupled to an output end OUT of a next stage shift register and the driving circuit 920 of the next stage shift register.. In FIG. 10, a feedback circuit 1030 of each stage shift register 528 is electrically coupled to a driving circuit 1020 of a next stage shift register and a second clock signal XCK, hence the feedback circuit 1030 can be utilized to transmit the second clock signal XCK to a control switch 1032 and an output switch 1034 while the feedback circuit 830 is being turned on by a driving signal Q(N+1) outputted by the driving circuit 1020 of the next stage shift register.

In conclusion, the feedback circuit of the shift register of the present invention is being turned on by the signal generated by a next stage shift register, hence the feedback circuit will not be continuously driven for an extended time.

In comparison to the prior art, the shift register of the present invention is more efficient and has a longer operation lifespan. The present invention utilizes a method of activating a control switch and an output switch by a driving signal Q(N+1) generated by a driving circuit of a next step shift register, which has a better activating ability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register capable of turning on a feedback register, comprising:
   a signal generating circuit for generating an output signal at an output end of the shift register according to a first clock signal and a driving signal while the signal generating circuit is being turned on;
   a driving circuit, electrically coupled to the signal generating circuit, for generating the driving signal to control the signal generating circuit according to an input signal received from an output end of a previous stage shift register by an input end of the shift register;
   a feedback circuit, comprising a gate electrode electrically coupled to an output end of a next stage shift register for receiving an output signal of the next stage shift register, a drain electrode electrically connected to a gate electrode of a signal generating circuit of the next stage shift register and a source electrode of a driving circuit of the next stage shift register for receiving a driving signal of the next stage shift register, and a source electrode for transmitting a control signal while the feedback circuit is being turned on by the output signal outputted from the output end of the next stage shift register, wherein the control signal is the driving signal generated by the driving circuit of the next stage shift register; and
   a control switch, comprising a drain electrode electrically coupled to the signal generating circuit, and a gate electrode electrically connected to the source electrode of the feedback circuit, for directly receiving the control signal from the source electrode of the feedback circuit for turning off the signal generating circuit while the control switch is being turned on by the control signal transmitted from the feedback circuit.

2. The shift register of claim 1, further comprising an output switch, comprising a gate electrode electrically connected to the source electrode of the feedback circuit, for directly receiving the control signal from the source electrode of the feedback circuit for resetting the output signal outputted by the output end of the shift register while the output switch is being turned on by the control signal.

3. The shift register of claim 1, wherein the feedback circuit is electrically coupled to the output end of the next stage shift register and a second clock signal source for transmitting the control signal while the feedback circuit is being turned on by the output signal outputted from the output end of the next stage shift register, the control signal is a second clock signal, and phase of the second clock signal is opposite to phase of the first clock signal.

4. The shift register of claim 1, wherein the feedback circuit is electrically coupled to the output end of the next stage shift register and the driving circuit of the next stage shift register for transmitting the control signal while the feedback circuit is being turned on by the driving signal generated by the driving circuit of the next stage shift register, and the control signal is the output signal outputted by the output end of the next stage shift register.

5. The shift register of claim 1, wherein the feedback circuit is electrically coupled to the driving circuit of the next stage shift register and a second clock signal source for transmitting the control signal while the feedback circuit is being turned on by the driving signal generated by the driving circuit of the next stage shift register, the control signal is a second clock signal, and phase of the second clock signal is opposite to phase of the first clock signal.

6. The shift register of claim 1, further comprising a reset circuit, electrically coupled to the output end of the shift register and the signal generating circuit, for outputting an output signal according to the signal generating circuit being turned off and the output end of the shift register being reset by the first clock signal.

7. The shift register of claim 1, wherein the input end of the shift register is electrically coupled to the output end of the previous stage shift register.

8. The shift register of claim 1, wherein a gate of the feedback circuit is electrically connected to a gate of a driving circuit in a next stage shift register.

9. The shift register of claim 1, further comprising an output switch, wherein the signal generating circuit, the feedback circuit, the control switch, and the output switch are each a transistor, and a source of the feedback circuit is connected to a gate of the output switch.

10. A liquid crystal display (LCD), comprising:
    a display array; and
    a gate driving circuit for generating a plurality of gate signals for driving the display array, the gate driving circuit comprising a plurality of stage shift registers electrically coupled in series, each stage shift register comprising:
      a signal generating circuit for generating an output signal at an output end of the shift register according to a first clock signal and a driving signal while the signal generating circuit is being turned on according to a first clock signal;
      a driving circuit, electrically coupled to the signal generating circuit, for generating the driving signal to control the signal generating circuit according to an input signal received from an output end of a previous stage shift register by an input end of the shift register;
      a feedback circuit, comprising a gate electrode electrically coupled to an output end of a next stage shift register for receiving an output signal of the next stage shift register, a drain electrode electrically connected to a gate electrode of a signal generating circuit of the next stage shift register and a source electrode of a driving circuit of the next stage shift register for receiving a driving signal of the next stage shift register, and a source electrode for transmitting a control signal while the feedback circuit is being turned on by the output signal outputted from the output end of the next stage shift register, wherein the control signal is the driving signal generated by the driving circuit of the next stage shift register; and a control switch, comprising a drain electrode electrically coupled to the signal generating circuit, and a gate electrode electrically connected to the source electrode of the feedback circuit, for directly receiving the control signal from the source electrode of the feedback circuit for turning off the signal generating circuit while the control switch is being turned on by the control signal transmitted from the feedback circuit.

11. The LCD of claim 10, wherein the shift register further comprises an output switch, electrically coupled to the output end of the shift register and the feedback circuit, for resetting the output signal outputted by the output end of the shift register while the output switch is being turned on by the control signal transmitted from the feedback circuit.

12. The LCD of claim 10, wherein the feedback circuit of the shift register is electrically coupled to the output end of the next stage shift register and a second clock signal source for transmitting the control signal while the feedback circuit is being turned on by the output signal outputted from the output end of the next stage shift register, the control signal is a second clock signal, and phase of the second clock signal is opposite to phase of the first clock signal.

13. The LCD of claim 10, wherein the feedback circuit of the shift register is electrically coupled to the output end of the next stage shift register and the driving circuit of the next stage shift register for transmitting the control signal while the feedback circuit is being turned on by the driving signal generated by the driving circuit of the next stage shift register, and the control signal is the output signal outputted by the output end of the next stage shift register.

14. The LCD of claim 10, wherein the feedback circuit of the shift register is electrically coupled to the driving circuit of the next stage shift register and a second clock signal source for transmitting the control signal while the feedback circuit is being turned on by the driving signal generated by the driving circuit of the next stage shift register, the control signal is a second clock signal, and phase of the second clock signal is opposite to phase of the first clock signal.

15. The LCD of claim 10, wherein the shift register further comprises a reset circuit, electrically coupled to the output end of the shift register and the signal generating circuit, for outputting an output signal according to the signal generating circuit being turned off and the output end of the shift register being reset by the first clock signal.

16. The LCD of claim 10, wherein the input end of the shift register is electrically coupled to an output end of a previous stage shift register.

17. The LCD of claim 10, wherein a gate of the feedback circuit is electrically connected to a gate of a driving circuit in a next stage shift register.

18. The LCD of claim 10, wherein each stage shift register further comprises an output switch, and the signal generating circuit, the feedback circuit, the control switch, and the output switch are each a transistor, and a source of the feedback circuit is connected to a gate of the output switch.

19. The LCD of claim 10, wherein each stage shift register further comprises an output switch comprising a gate electrode electrically connected to the source electrode of the feedback circuit for directly receiving the control signal from the source electrode of the feedback circuit for resetting the output signal outputted by the output end of the shift register while the output switch is being turned on by the control signal.

* * * * *